United States Patent [19]
Nakata et al.

[11] Patent Number: 4,777,374
[45] Date of Patent: Oct. 11, 1988

[54] PATTERN POSITION DETECTING METHOD AND APPARATUS FOR DETECTING THE POSITION OF AN ALIGNMENT DIRECTION OF A WAFER TARGET PATTERN

[75] Inventors: Toshihiko Nakata, Yokohama; Yoshitada Oshida, Fujisawa; Masataka Shiba, Yokohama, all of Japan

[73] Assignee: Hitachi, Ltd., Tokyo, Japan

[21] Appl. No.: 868,601

[22] Filed: May 30, 1986

[30] Foreign Application Priority Data

Jun. 3, 1985 [JP] Japan ................. 60-118969

[51] Int. Cl.[4] .................................. G01N 21/86
[52] U.S. Cl. ................................ 250/548; 356/401
[58] Field of Search ............ 250/548, 557, 561; 356/309, 400, 401, 152; 364/490, 491, 559

[56] References Cited
U.S. PATENT DOCUMENTS 4,573,791 3/1986 Phillips ........................ 250/548
4,592,648 6/1986 Tabarelli et al. .............. 250/548
4,597,669 7/1986 Terasawa et al. ............. 250/548
4,614,432 9/1986 Kuniyoshi et al. ............ 356/401
4,668,089 5/1987 Oshida et al. ................. 356/152

Primary Examiner—David C. Nelms
Assistant Examiner—Jessica Ruoff
Attorney, Agent, or Firm—Antonelli, Terry & Wands

[57] ABSTRACT

A pattern position detecting method and an apparatus comprises spatial coherence variable means for illuminating a two-dimensional pattern formed on a wafer and its vicinity through a projection lens under the state that spatial coherence of pattern illumination light is elevated in one direction with respect to said two-dimensional pattern and lowered in the other direction perpendicular to said one direction. Two-dimensional reflection images from the pattern and its vicinity obtained through the lens are image-formed by an image-formation optical system. The intensity distribution of the two-dimensional reflection light is detected by light-intensity-distribution detection means so that a detection signal produced from this detection means indicates the position of the two-dimensional pattern.

10 Claims, 14 Drawing Sheets

PATTERN POSITION DETECTING METHOD AND APPARATUS FOR DETECTING THE POSITION OF AN ALIGNMENT DIRECTION OF A WAFER TARGET PATTERN

BACKGROUND OF THE INVENTION

The present invention relates to a pattern position detecting method for detecting the center position of a two-dimensional pattern and an apparatus for detecting the same and, more particularly, to a pattern position detecting method and an apparatus suited to the detection of a pattern for alignment when the reduced projection exposure of a circuit pattern onto a wafer are performed by reduction projection exposure equipment.

Generally, in reduced projection exposure equipment, a circuit pattern 4 on a reticle 1 and a wafer 3 on a wafer stage 7 are disposed with certain distance to allow a reduction projection lens 2 to be arranged therebetween as shown in FIG. 11. A condenser lens 18 is also provided at the upper position of the circuit pattern 4 on the, reticle 1. Exposure light from an exposure light source (not shown) is used to irradiate the circuit pattern 4 through the condenser lens 18 so that the reduction projection, exposure and duplication of the circuit pattern 4 is sequentially repeated for chips 51, 52, 53, etc. through an incident pupil 19 of said lens 2. To this end, the exact positioning of the circuit pattern 4 with each of the chips 51 to 53 is indispensable. This positioning, for example, of the chip 51 is performed using the so-called TTL (through-the-lens) alignment technique in which wafer target patterns 91 and 92 formed on the wafer 3 in advance and reticle reference patterns 81 and 82 (window patterns) formed on the reticle 1 beforehand are correctly positioned through the reduction projection lens 2.

However, in the conventional reduced projection exposure equipment 12, wafer-target-pattern-illumination light 10 is incident onto the center of the incident pupil 19 of the reduced projection lens 2 through a half-mirror 11 and the reticle reference pattern (window pattern) 81 to irradiate the wafer target pattern 91. Reflected light from the pattern 91 is again magnified and image-formed on the reticle reference pattern 81 through the reduction projection lens 2. Said patterns 81 and 91 are projected on the movable slit 13 by the magnification lens 12a. By the scanning of the movable slit 13, one dimensional signal 10a is output to a pre-processing circuit 16 from a photomultiplier 15 through a relay lens 14 and sent to a computer 17 after being subjected to the analog-to-digital (A/D) conversion at the circuit 16. Each center position of the reticle reference pattern 81 and the wafer target pattern 91 is obtained at the computer 17 to calculate the amount of alignment due to the difference between the center positions of those patterns 81 and 91. The wafer stage 7 is drive-controlled toward the x-direction depending on the alignment amount. The drive control of the stage 7 in the y-direction can be performed by the method similar to that of the x-direction drive control using the reticle reference pattern 82 and the wafer target pattern 92 specially provided for this purpose. For details of conventional equipment of this kind, reference can be made to the Japanese Patent Publication Nos. 144270/1978 and 99374/1979, for instance.

However, the following disadvantages can be pointed out in such conventional alignment equipment.

Since the reduction projection lens is generally designed to provide the best image formation for monochromatic light such as g line, it is necessary to use light having a narrow spectral width to be as close to monochromatic light as possible or laser light as the wafer-target-pattern illumination light.

However, the use of the light having a narrow spectral width causes a phase difference between light 20a reflecting and diffracting on a pattern 31 and light 20b reflecting and diffracting within the wafer target pattern 91 when the wafer-target-pattern-illumination light 10 is incident onto a resist 32 as shown in FIGS. 2(a) and 2(b). As a result, multiple interference is caused due to these reflected diffraction lights 20a and 20b having a different phase. Particularly, multiple interference fringes of narrow width appear in the usual pattern edge portion in which the film thickness of the resist 32 changes abruptly. The above-mentioned intensity of multiple interference consequently varies slightly to produce noise in said one dimensional signal 10a output to the pre-processing circuit 16 from the photomultiplier 15 as shown in FIG. 2(c). The relationship between said intensity of multiple interference and the film thickness of the resist 32 is shown in FIG. 3. In the drawing, a curve indicative of said intensity is shifted toward the left-hand and right-hand directions in response to an incident angle of 0° at which light is given perpendicularly to the resist 32 (indicated at a solid line) and an incident angle of 20° onto the resist 32 (indicated at a broken line).

Also, FIG. 4(a) is an enlarged perspective view of the state in which the wafer-target-pattern-illumination light 10 incident onto the center of said incident pupil 19 irradiates the wafer target pattern 91 in FIG. 1. As shown in FIG. 4(a), although the light 10 is given to the pupil 19 with the uniform quantity of light, an area 102 in which the incidence is made at an inclined angle $\alpha$ of 20° (reduction projection lens NA=0.38) is larger than an area 101 corresponding to the perpendicular incidence ($\alpha=0°$). In other words, since the area 102 has energy greater than that of the area 101, the relationship between the film thickness of the resist 32 and the intensity of multiple interference assumes the state as indicated by the broken line in FIG. 3. On the other hand, most of reflected diffraction light 21 of said illumination light 10 with respect to light 103 from the area 101 is given to the incident pupil 19 of the reduction projection lens 2 as shown in FIG. 4(b). However, about one-half of high frequency components (indicated at oblique lines) of reflected diffraction light 22 from the target pattern 91 with respect to light 104 from the area 102 for the inclined incidence cannot reach the incident pupil 19 by the disturbance of an outer frame 2a of said lens 2. The resultant detection signal 10a of the wafer target pattern 91 is shown in FIG. 4(e). As shown in FIG. 4(e), the pattern edge portion is not sharp as compared with that of FIG. 4(d). As a result, the contrast of the detection signal 10a is lowered to degrade the accuracy of alignment.

SUMMARY OF THE INVENTION

An object of the invention is therefore to provide a pattern position detection method and an apparatus for detecting the same free from the above-mentioned disadvantages in the prior art and capable of producing a detection signal with high contrast without affecting high frequencies of reflected diffraction light from a pattern to be detected.

According to one aspect of the invention for achieving this object, a two-dimensional pattern and its vicinity are illuminated under the state that the spatial coherence of pattern illumination light is elevated in one direction with respect to the two-dimensional pattern and lowered in the direction perpendicular to said one direction, so that a detection signal with high contrast can be produced without affecting the high frequency components of the reflected diffraction light from the pattern to be detected. For instance, when the invention is applied to the detection of a wafer target pattern in the alignment of a reticle and a wafer in reduction projection exposure equipment, an increase in the contrast of the detection signal can be achieved as compared with the conventional equipment. Also, such a pattern detection is less vulnerable to the unevenness of the resist coating, resulting in the reduction of speckle noise in the Al rough surface. As a result, the improvement of alignment accuracy and further that of the productivity of semiconductors can be attained.

Besides, according to another aspect of the invention, spatial coherence variable means is employed to elevate the spatial coherence of the pattern illumination light in one direction with respect to said two-dimensional pattern and lower the spatial coherence in the other direction perpendicular to said one direction.

BRIEF DESCRIPTION OF THE DRAWINGS

The present invention will be described in more detail with reference to the accompanying drawings in which.

In the drawings, identical numerals denote identical structural elements.

DESCRIPTION OF THE PREFERRED EMBODIMENTS

Figure 5:
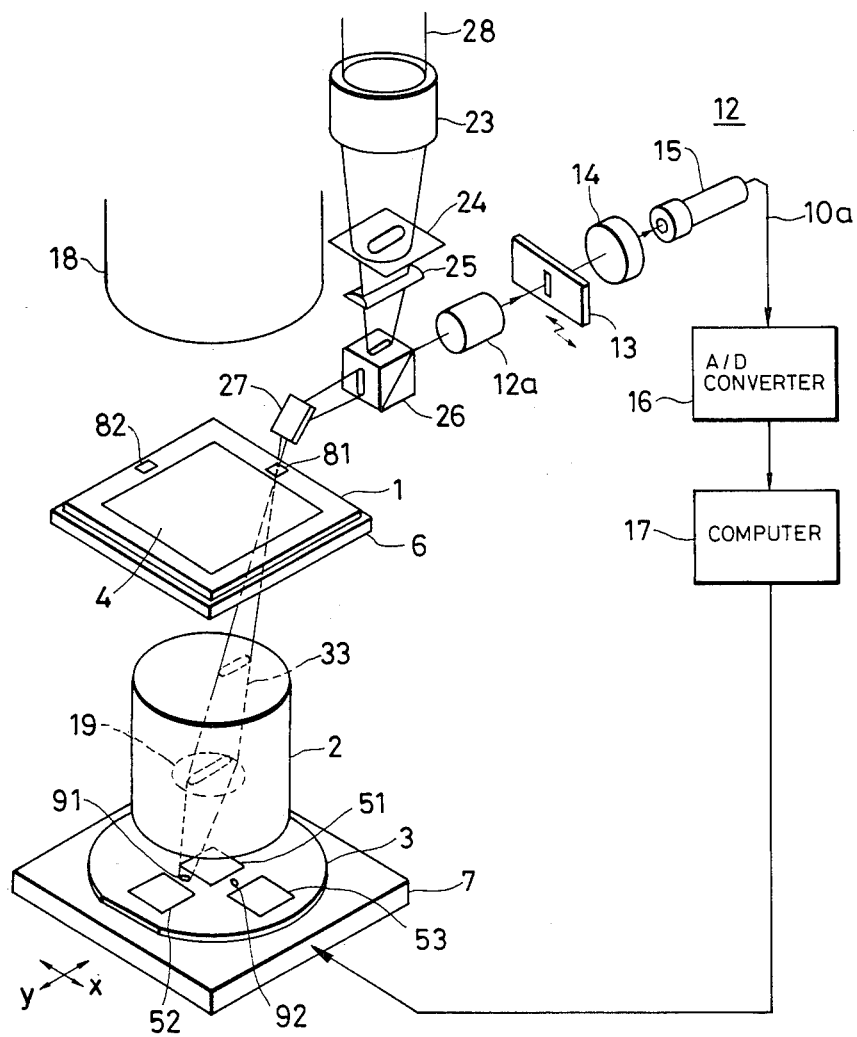
FIG. 5 is a perspective view of a wafer target pattern detection system of one embodiment of the invention.
Figure 6A:
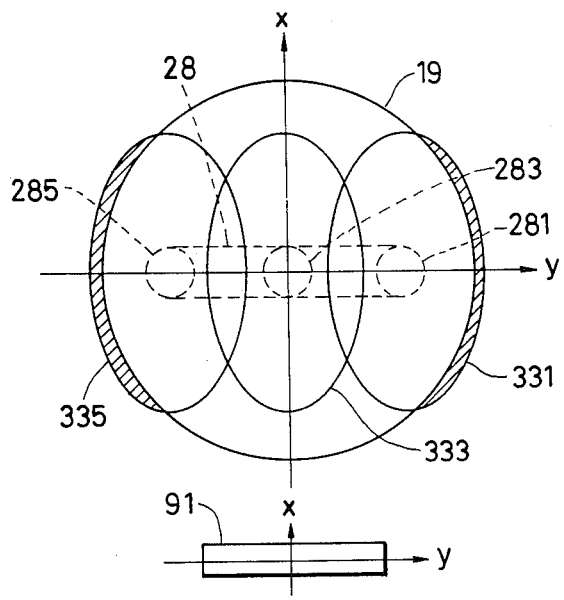
FIG. 6(a) and 6(b) are plan views for describing illumination light at an incident pupil of a reduction projection lens and the spread of corresponding reflected diffraction light in the embodiment.
Figure 6B:
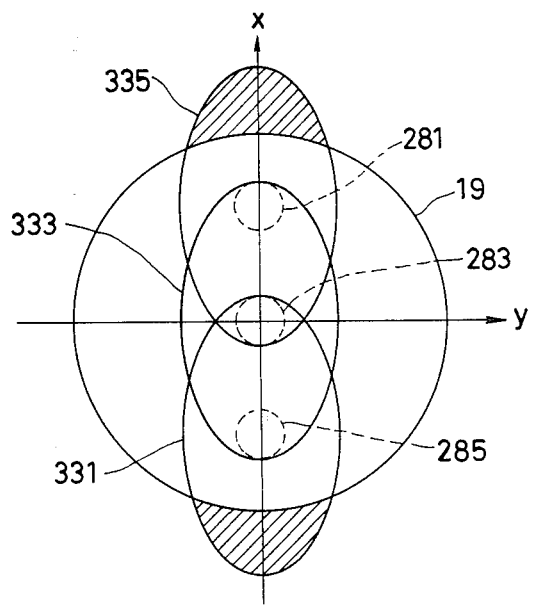
Figure 7:
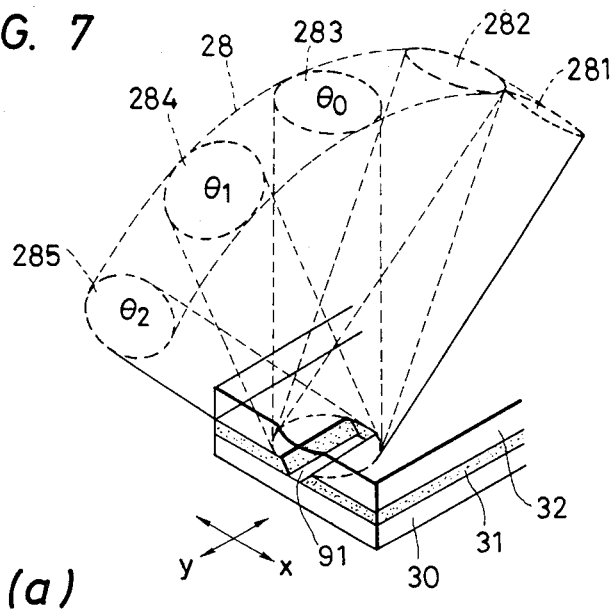
FIG. 7 is a perspective view of illumination light incident onto a wafer target pattern.
Figure 8A:
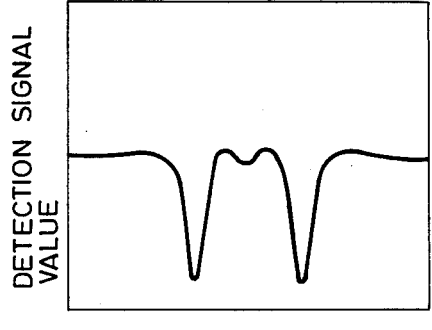
FIG. 8(a) is a waveform diagram for showing a detection signal of the wafer target pattern in the invention.
Figure 8B:
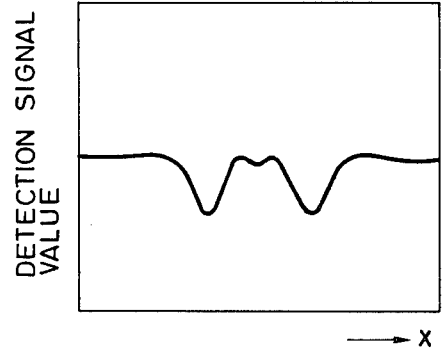
FIG. 8(b) is a waveform diagram for showing a detection signal of the wafer target pattern in the prior art.
Figure 9:
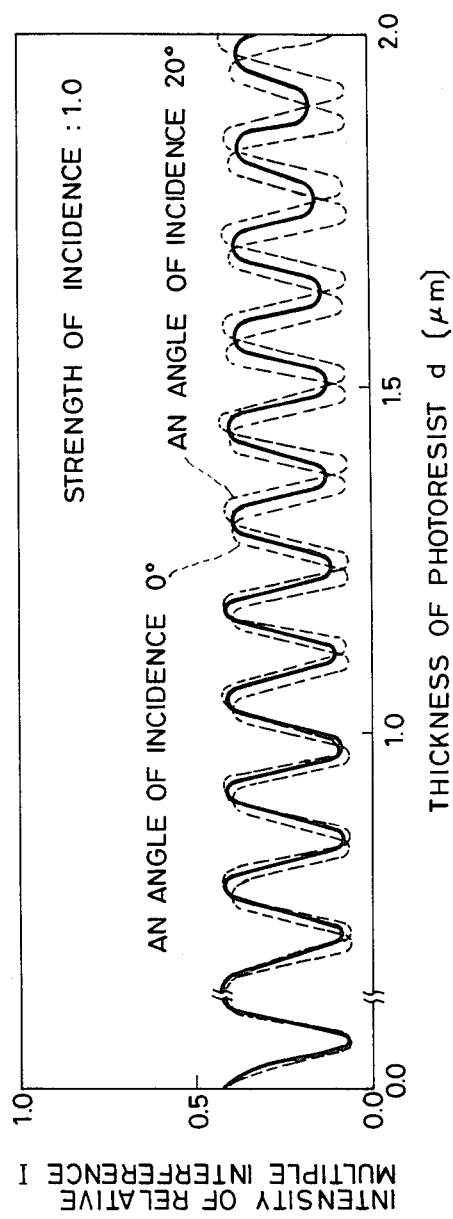
FIG. 9 shows a diagram for describing the relationship between the film thickness of a resist and the intensity of multiple interference.

Embodiments of the present invention will be described referring to FIGS. 5 to 17. FIG. 5 shows a perspective view of a wafer-target-pattern-detection apparatus of one embodiment of the invention. FIG. 6(a) is a plan view for describing illumination light at an incident pupil of a reduction lens in the embodiment and the spread of the reflected diffraction light of the illumination light. FIG. 6(b) is a plan view for describing illumination light at an incident pupil of a reduction lens in the prior art and the spread of the reflected diffraction light of its illumination light. FIG. 7 shows a perspective view for illustrating illumination light incident onto a wafer target pattern in the invention. FIG. 8(a) is a waveform diagram of a detection signal of the wafer target pattern in the invention. FIG. 8(b) is a waveform diagram of a detection signal of a wafer target pattern in the prior art. FIG. 9 shows a diagram for describing the relationship between the film thickness of a resist and the intensity of multiple interference in the invention. FIGS. 10(a) to (d) are diagrams for describing the elimination of the influence caused by the variation of the resist film thickness.

As shown in FIG. 5, in response to the incidence of light 28 such as g line or d line through a condenser 23 onto a slit 24 having a thin and long shape like a strip pattern in the y-direction (on a wafer 3), the light emitted from the slit 24 is further stopped in the x-direction (on the wafer 3) by a cylindrical lens 25 and given to an incident pupil 19 of a projection lens 2 through a beam splitter 26, a half-mirror 27 and a reticle reference pattern 81 (window pattern). The light 28 is selected by an interference filter from a white light source such as a mercury lamp (although not shown). The light 28 emitted from the incident pupil 19 then irradiates a wafer target pattern 91. Reflected diffraction light 33 from the pattern 91 is again magnified and image-formed on the reticle reference pattern 81 through the reduction projection lens 2. It is to be noted that the image formation position of the wafer target pattern 91 comes outside of the reticle 1 due to the chromatic aberration of the lens 2 when light other than the g line having an exposure wavelength is employed as said wafer-target-pattern-illumination light 28. For this reason, although it is necessary to perform the detection of the reticle reference pattern 81 by the use of another optical system, detailed description is omitted here.

Figure 1:
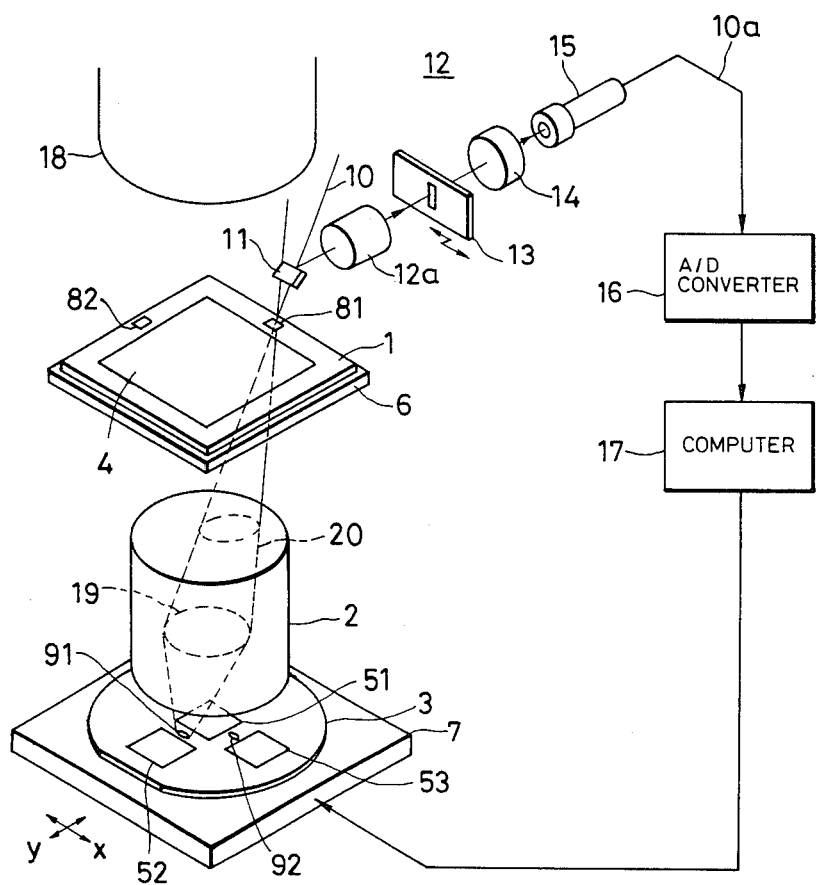
FIG. 1 shows a perspective view of a pattern detection system of conventional reduction projection exposure equipment.
Figure 2A:
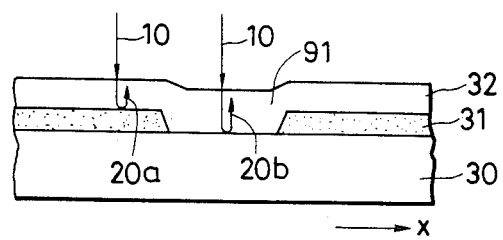
FIG. 2(a) is a cross-sectional front view of a conventional wafer target pattern.
Figure 2B:
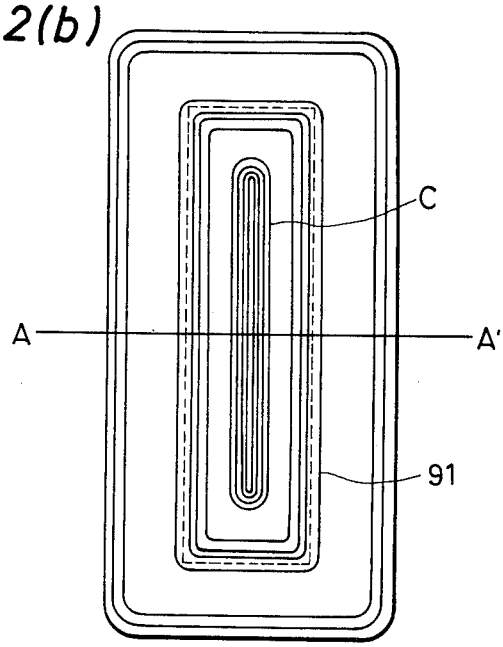
FIG. 2(b) is a plan view of the wafer target pattern of FIG. 2(a)
Figure 2C:
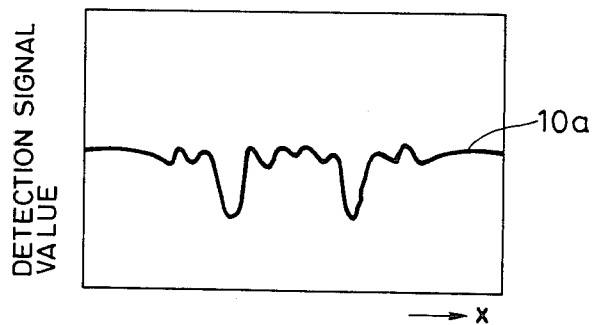
FIG. 2(c) is a waveform diagram of the intensity of a detection signal.

Said patterns 81 and 91 are image-formed on a movable slit 13 by an enlargement lens 12. With the scanning of the slit 13, a detection signal 10a is output from a photomultiplier 15 through a relay lens 14. The amount of alignment is then obtained in a manner similar to FIG. 1 and followed by the drive control of a wafer stage into the x-direction. The wafer-target-illumination light 28 is stopped into the x-direction by a slit 24 and a cylindrical lens 25. Since the invention provides the structure in which the light gives a fully long strip pattern in the direction (y-direction) perpendicular to the direction of the position detection of the wafer target pattern 91 in the incident pupil 19, the light 28 incident onto the pattern 91 is kept in almost parallel to the x-direction. Spatial coherence is enhanced in the x-direction. On the other hand, since luminous fluxes 281 to 285 are given from many angles in the y-direction, the spatial coherence is low. As a result, those fluxes 281 to 285 incident onto the pattern 91 become equal to the state that the area 102 for allowing the wafer-target-pattern illumination light 10 to be given with an inclined angle for the incidence to the pattern 91 is cut along the y-direction, i.e., the direction perpendicular to the pattern-position detection direction.

Consequently, reflected diffraction light 33 from the wafer target pattern 91 becomes luminous fluxes 331 to 335 spreading toward the x-and y-directions as indicated at solid lines in FIG. 6. However, since the incidence of most of the fluxes 331 to 335 is limited within the range of the incident pupil 19, high frequency components of the reflected diffraction light 33 are held as they are.

In contrast, a part (the portions shown at oblique lines) of the reflected diffraction light 331 and 335 corresponding to the incident luminous fluxes 281 and 283, particularly high frequency portions cannot be given as incident lights within the range of the incident pupil 19 as shown in FIG. 6(b). For this reason, the intensity of the detection signal in the present invention has less loss of the high frequency components and has higher signal contrast as shown in FIG. 8(a) compared with that of the prior art. In addition, the incident luminous fluxes 281 to 285 given from various angles along the y-direction have equal energy in the invention, the reflected diffraction light 331 through 335 from the wafer target pattern 91 are equal to the state that multiple interferences in the resist 32 at various incident angles $\theta_0-\theta_n$ are superimposed.

Figure 3:
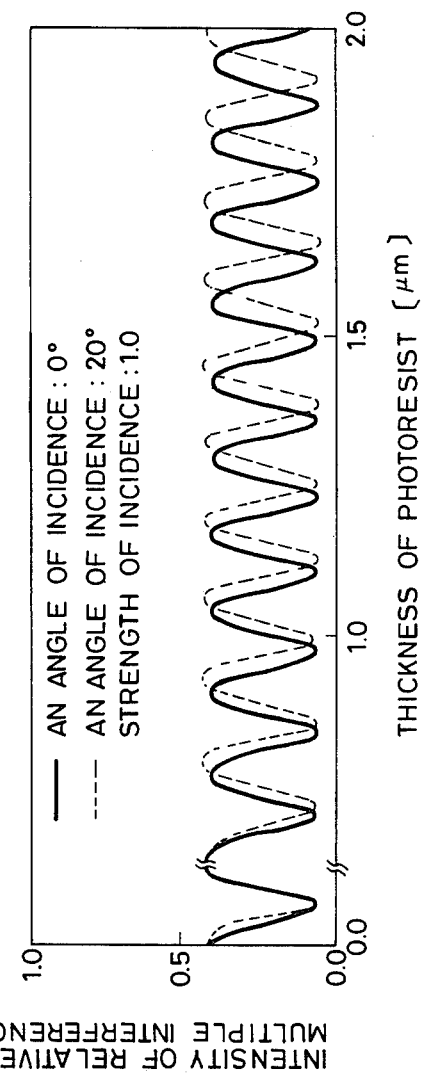
FIG. 3 is a diagram for describing the relationship between the film thickness of a resist and the intensity of multiple interference when the incident angle of conventional illumination light is selected as a parameter.
Figure 10A:
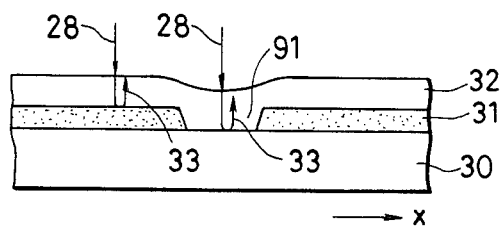
FIG. 10(a) is a cross-sectional view of the wafer target pattern.
Figure 10B:
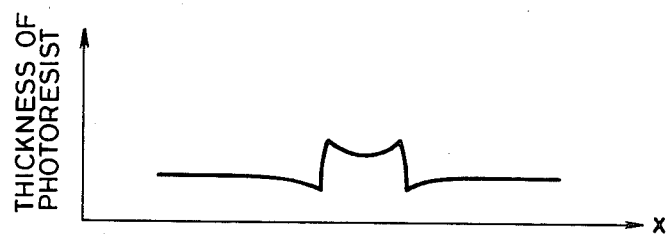
FIG. 10(b) is a plan view of the wafer target pattern.
Figure 10C:
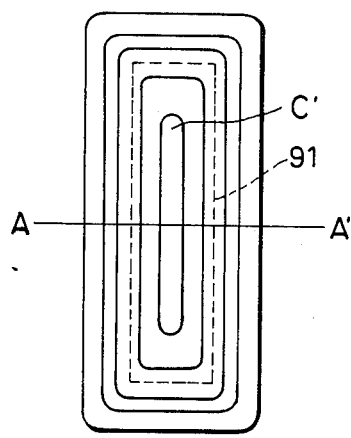
FIG. 10(c) is a plan view of the multiple interference.
Figure 10D:
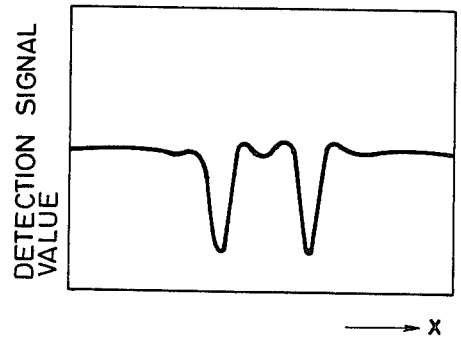
FIG. 10(d) is a waveform diagram of the intensity of the detection signal.
Figure 13:
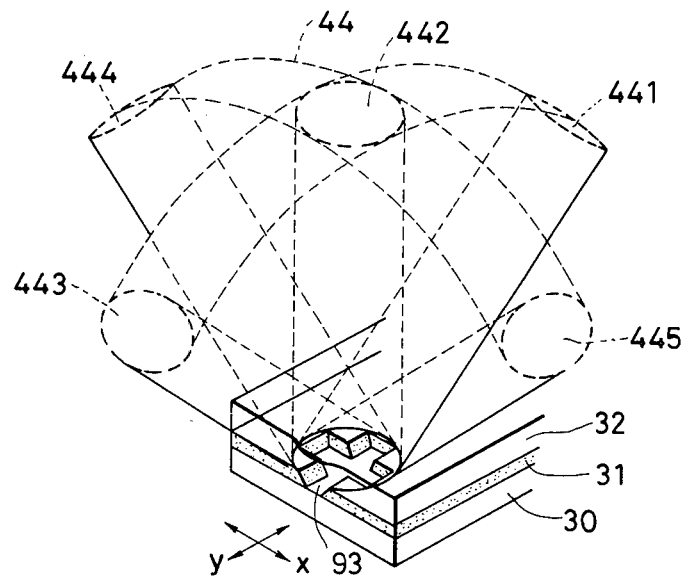
FIG. 13 is a perspective view of the illumination light incident onto the wafer target pattern.

Therefore, the relationship between the resist film thickness and the multiple interference intensity becomes the load average of the curves corresponding to each angle when the incident angle is changed from 0° to 20° (in the case of reduction projection lens NA=0.38) in FIG. 13. As a result, said relationship is represented by a curve shown at a solid line (broken lines indicate the case of incident angles 0° and 20°). In other words, the curve shown at the solid line in FIG. 9 has small vibrations and is not vulnerable to the lack of uniformity of the resist coating as compared with the case of the conventional wafer-target-pattern illumination light 10 shown at a broken line in FIG. 3. For details of this situation, FIG. 10(a) shows the structure of the wafer target pattern 91 and the light 28 incident thereon and the reflected diffraction light 33; FIG. 10(b) shows the resist-film-thickness distribution in the vicinity of said pattern 91; FIG. 10(c) shows its multiple interference fringes; and FIG. 10(d) shows the detection-signal-intensity distribution. Apparently, in contrast to FIGS. 10(b) and (c), the generation of fine multiple interference fringes C' due to the abrupt change of the film thicknesses of the resist at the pattern edge portion is reduction to provide a detection signal with high S/N ratio. Moreover, in the invention, spatial coherence is low in the y-direction perpendicular to the pattern-position-detecting direction (x-direction), the generation of fine scattering light can be reduced in the detection of a pattern having a high degree of grain such as an Al pattern, resulting in the improvement of pattern detection accuracy.

Next, another embodiment of the present invention will be described referring to FIGS. 11 to 13. Identical structural elements to FIG. 5 are depicted by identical numerals. In addition to the optical system 12 for the wafer-target-pattern detection in the x-direction, the movable slit 13 of the optical system 12, the movable slit 13, the movable slit 42 rotated by an angle of 90° with respect to the optical axis 10a, the slit 38 and the cylindrical lens 39, the embodiment of FIG. 11 comprises a condenser 23 of said optical system 12, the beam splitter 26, a magnification lens 12a, the relay lens 14, the photomultiplier 15, a condenser 37 having the same structure as a pre-processing circuit 16 and a computer 17, a beam splitter 40, a magnification lens, a relay lens 43, a photomultiplier 43b, an optical system 36 for the wafer pattern detection in the y-direction having the pre-processing circuit 16 and the computer 17, and a movable mirror 34 for coupling said both optical systems 12 and 36.

In the detection of the amount of the x-direction alignment, the movable mirror 34 is rotated toward the direction indicated at an arrow a in the drawing so that the optical system 12 can detect a thin and long strip pattern in the y-direction. On the other hand, for the detection of the amount of the y-direction alignment, the movable mirror is rotated toward the direction shown at an arrow b in the drawing so as to permit the optical system 36 to detect a thin and long strip pattern in the x-direction. In the drawing, numeral 35 shows a mirror. Also, since the operation of the optical systems 12 and 36 and the drive of the wafer stage 7 are the same with those of the optical system 12 for the wafer-target-pattern detection in the x-direction, their detailed description will be omitted.

Figure 11:
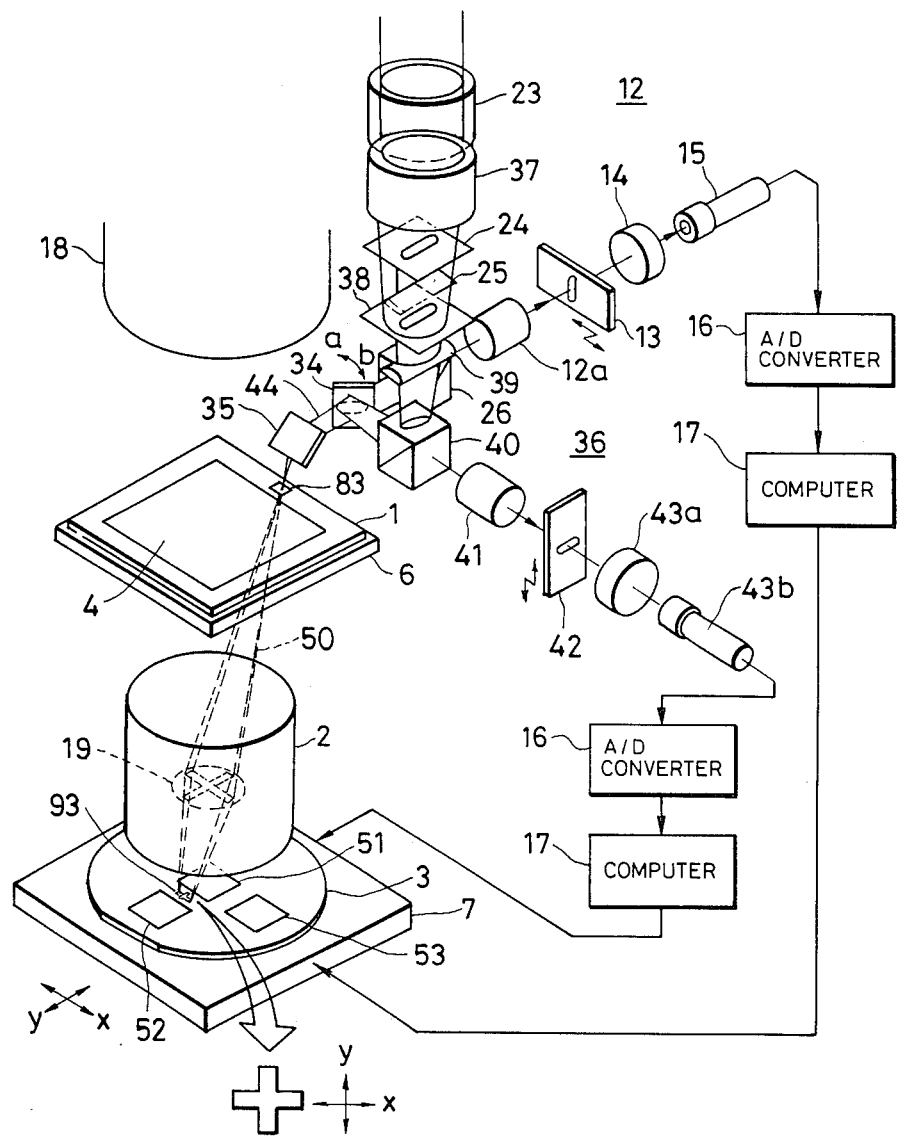
FIG. 11 is a perspective view of a wafer target pattern detection system of another embodiment of the invention.
Figure 12:
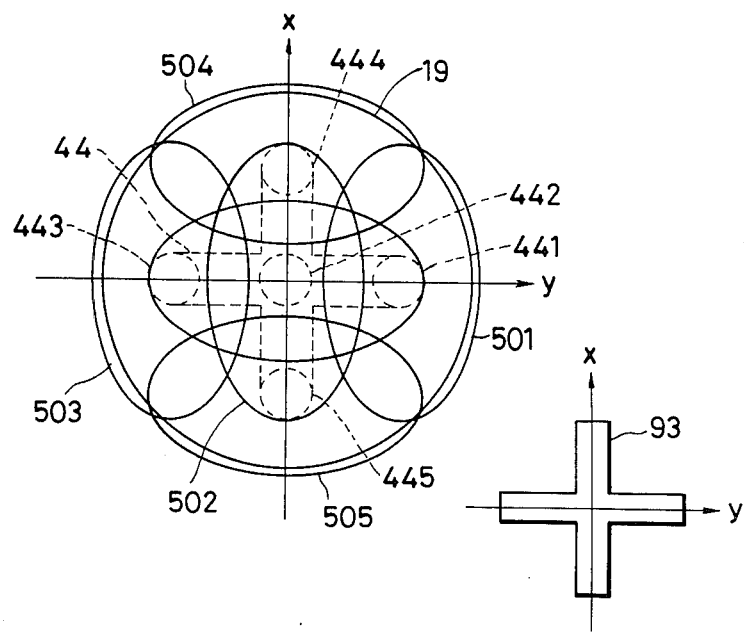
FIG. 12 is a plan view for showing illumination light in the incident pupil of the reduction projection lens and the spread of its reflected diffraction light.

As shown in FIG. 11, a wafer target pattern 93 is made in the form of cross. The distribution of wafer-target-pattern-illumination light 44 (see FIG. 11) in the incident pupil 19 of the reduction projection lens 2 is formed in a cross shape corresponding to that of said wafer target pattern 93 as shown in FIG. 12. For this reason, as shown in FIG. 13, lights incident on the wafer target pattern 93 are in parallel with each other in the position detection direction with respect to all strip patterns in the x- and y-directions except for the central portion of the pattern 93. As a result, the above-mentioned spatial coherence becomes high. However, the spatial coherence is low with respect to the direction perpendicular to the position detection direction because of the presence of luminous fluxes 441 to 445. Therefore, most of reflected diffraction light 501 to 505 from the pattern 93 is given as incident light within the range of the incident pupil 19 as shown at solid lines in FIG. 12. As a result, a wafer-pattern-detection signal with sharp contrast can be produced. It is to be noted that the resolution can be further improved to permit the alignment detection of high accuracy by the use of ultraviolet light as said wafer-target-pattern-illumination light 44.

Although the above-mentioned embodiments show the cases where the present invention is implemented in the TTL-pattern-detection optical system of the reduction projection equipment, the invention is not limited to those embodiments and can be applied to general pattern positioning equipment such as a wafer pattern checking device. Further, although a spectral line of a mercury lamp is employed in the above-mentioned embodiments, the invention is not restricted to this structure. For instance, it is possible to use white light having high spatial coherence such as laser light. The use of this laser light contributes to the increase of the amount of detected light so that a solid-state image pickup element can be adopted in place of the photomultiplier. As a result, the whole construction of the pattern detection system can be simplified.

Figure 14:
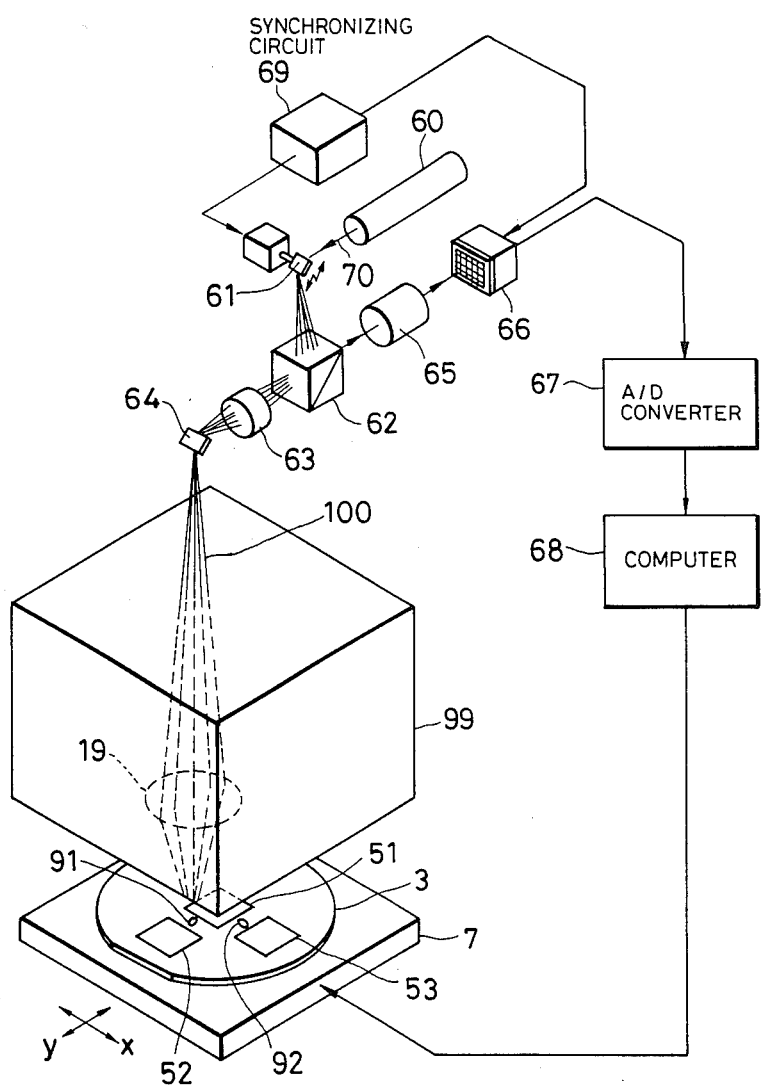
FIG. 14 shows a perspective view of a wafer target pattern detection system of still another embodiment of the invention.
Figure 15:
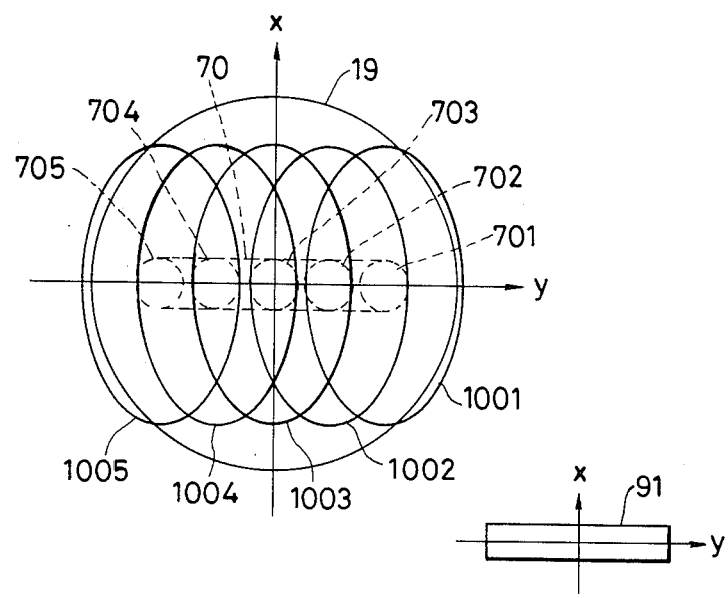
FIG. 15 is a plan view of the illumination light at the incident pupil of its image-formation optical system and the spread of its reflected diffraction light.
Figure 16:
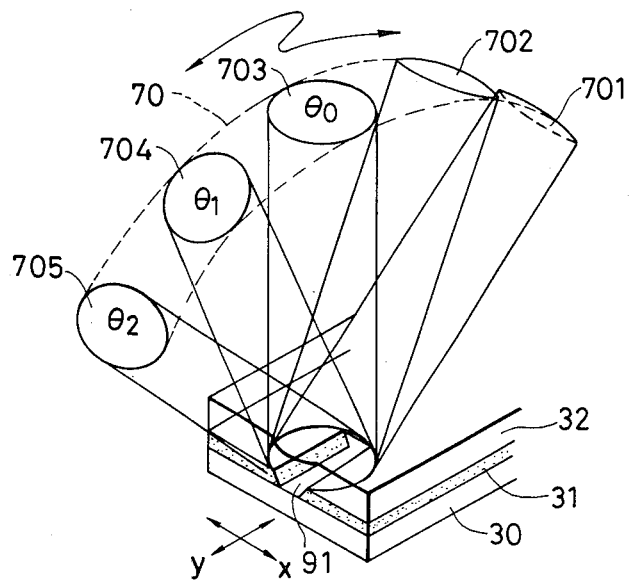
FIG. 16 is a perspective view of the illumination light incident onto the wafer target pattern.

Specifically, one application of the present invention to general wafer-pattern positioning equipment using laser light will be described referring to FIGS. 14 to 17. As shown in FIG. 14, beam light 70 emitted from laser light 60 is oscillated by a galvanomirror 61 toward the longitudinal direction of the wafter target pattern 91, that is, the y-direction perpendicular to the pattern detection direction (x-direction). The beam light 70 thus oscillated irradiates the target pattern 91 after passing a beam splitter 62, a relay lens 63, a mirror 64, and the incident pupil 19 of an image formation optical system 99 composed of an objective for alignment, a reduction projection optical system, a reflection type projection optical system, etc. Diffraction light reflected from the pattern 91 then passes the incident pupil 19 again. After this, the light is image-formed on the surface of a two-dimensional solid-state image pickup element 66, subjected to the A/D conversion and the data compression at a pre-processing circuit 67, and sent to a computer 68 so as to obtain the central position of the pattern 91. FIG. 15 shows the distribution (portion indicated at dash lines) of the wafer-target-pattern illumination light and the distribution (portion indicated at solid lines) of reflected diffraction light 100 from the wafer target pattern 91. As shown in FIG. 15, with the oscillation of the beam light 70 of the laser light 60 in the y-direction, the distribution of the wafer-target-illumination light 70 in the incident pupil 19 gives a strip pattern long enough in the y-direction.

As a result, the beam light incident onto the pattern 91 becomes a beam parallel with the x-direction to maintain a high degree of spatial coherence of the laser light.

Figure 17:
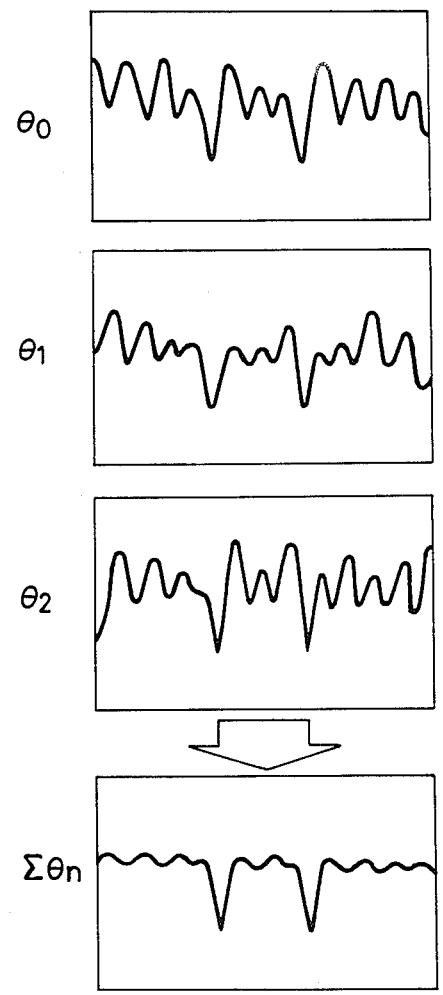
FIG. 17 is a diagram for describing the smoothing operation of Speckle noise caused by the rough surface of Al in each oscillation angle of an incident beam.

In addition, because beam light 701 to 705 is given at various incident angles ranging from $\theta_0$ to $\theta_2$ in the y-direction by the oscillation of the galvanomirror 61, the distribution of reflected diffraction light 100 from the pattern 91 gives a shape spreading towards the x-direction as shown at solid lines in FIG. 15. However, since most of those beam light is incident on the incident pupil 19, high frequency components of the diffraction light 100 are kept as they are so as to achieve high signal contrast. As mentioned above, the laser light 70 is employed in this embodiment. For this reason, since the spatial coherence in the x-direction is considerably high, random noise inherent to the laser light called Speckle noise appears in the detection signal in the use of the wafer having a high degree of grain such as an Al pattern. In view of this fact, the oscillation period $T_1$ of the galvanomirror 61 is synchronized with the storage time $T_2$ (usually 16.7 ms) of the two-dimensional solid-state image pickup element 66 by a synchronization circuit 69 shown in FIG. 14. More specifically, by the selection of $T_1 = T_2/n$ (n: period integer), reflected diffraction light 1001 to 1005 corresponding to the incident beam light 701 to 705 in respective oscillation angles $\theta_0$ to $\theta_n$ of n periods is stored within the storage time $T_2$ at the element 66. As a result, as shown in FIG. 17, detection signals containing the Speckle noise, which is caused at random depending on the oscillation angles $\theta_0$ to $\theta_n$, are added and averaged to produce a detection signal with high signal to noise ratio and the noise smoothed.

Besides, by the adoption of an ultraviolet laser as the laser light 60 in the above embodiment, the resolution of the wafer target pattern 91 is enhanced to allow the alignment detection with more accuracy.

Figure 4A:
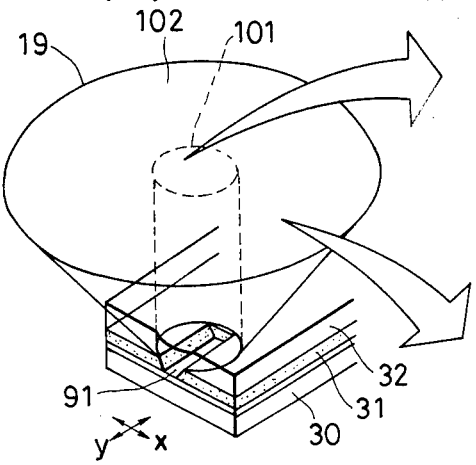
FIG. 4(a) shows a perspective view of the conventional wafer-target-pattern-illumination light.
Figure 4B:
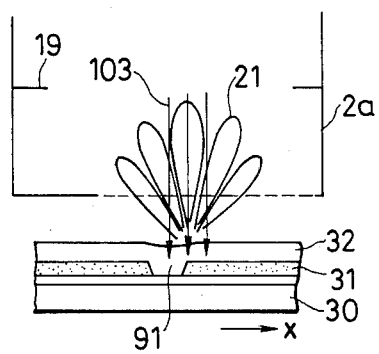
FIG. 4(b) is a diagram of reflected diffraction light corresponding to perpendicular incidence illumination light.
Figure 4C:
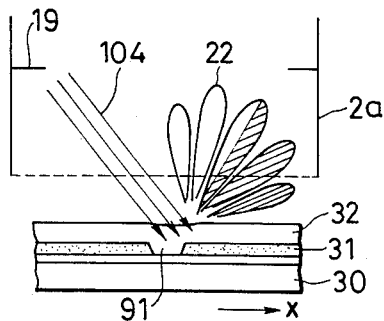
FIG. 4(c) is a diagram of reflected diffraction light corresponding to illumination light incident with a certain angle.
Figure 4D:
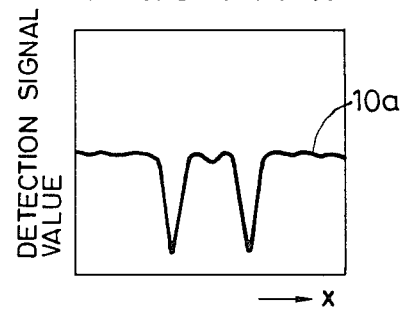
FIG. 4(d) is a waveform diagram of the intensity of a detection signal.

Moreover, the present invention is applicable to an off-axis pattern detection system using white light illumination or alignment optical system such as proximity exposure equipment like X-ray exposure equipment and contact exposure equipment. Specifically, no influence due to the multiple interference in the resist is present in the use of the white light illumination as mentioned with reference to FIGS. 15 and 16. However, as described referring to FIG. 4(c), the profile of the wafer-target-pattern detection signal is determined even if the white light is employed in the conventional illumination, because its energy is great.

Figure 4E:
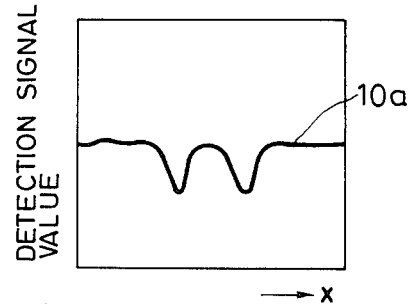
FIG. 4(e) is a waveform diagram of the intensity of the detection signal.

About one-half of high frequency components (portion indicated at oblique lines) of the reflected diffraction light from the wafer target pattern for light, which is given from the area having inclined incidence, are disturbed by the outer frame of the image-formation optical system and cannot be given to the incident pupil. As a result, the contrast of the detection signal is lowered as shown in FIG. 4(e). Even in the use of the white light illumination, the application of the present invention allows the realization of the detection signal with high contrast by elevating the spatial coherence in the position detecting direction of the wafer target pattern and lowering the spatial coherence in the direction perpendicular to said direction. As a result, alignment accuracy can be improved. The lens employed in the invention has the broad meaning to include a penetrating type and a reflection type image-formation optical systems.

As has been mentioned above, the wafer pattern detecting method and the apparatus of the invention enables obtaining a detection signal with high contrast without deteriorating high frequency components of the reflected diffraction light from a pattern to be detected. Therefore, in the case where the present invention is applied to the detection of a wafer target pattern in the alignment of a reticle and a wafer in reduction projection exposure equipment, increased contrast of the detection signal can be achieved as compared with the conventional system. Also, the equipment adopting the invention is not vulnerable to the unevenness of the resist coating and can achieve the reduction of Speckle noise in the rough surface of Al. As a result, the improvement of alignment accuracy can be attained to contribute to enhancing the productivity of semiconductors.

Although the present invention has been described with reference to the embodiments, it will be appreciated by those skilled in the art that various modifications, substitutions, etc. may be made without departing from the scope of the invention as defined by the appended claims.

What is claimed is:

1. A projection alignment apparatus for projecting a circuit pattern on a mask to a wafer through a projection lens, comprising:
    illuminating means for illuminating a slit-like monochromatic light having a narrow spectral width and being stopped so as to be substantilly parallel to an alignment direction at a right angle to a longitudinal direction of a wafer-target pattern and for providing light fluxes from a plurality of angles in a plane extending in the longitudinal direction of the wafer-target pattern and perpendicular to the wafer surface through the projection lens so that most high frequency components of reflected diffraction light fluxes are limited within the range of an incident pupil of the projection lens;
    an image-formation optical system for image-forming the reflected diffraction light fluxes from the wafer-target-pattern incident on the projection lens;
    light-intensity-distribution detection means for detecting an intensity distribution of the reflected diffraction light fluxes as to the alignment direction by effecting scanning of a scanning means in the alignment direction; and
    pattern position detecting means for detecting the position of the alignment direction of the wafer-target pattern in response to a detection signal of the light-intensity-distribution detection means.

2. A projection alignment apparatus according to claim 1, wherein said illuminating means includes a monochromatic light source, a slit member and a cylindrical lens.

3. A projection alignment apparatus according to claim 1, wherein said wafer-target-pattern is a strip pattern.

4. A projection alignment apparatus according to claim 1, wherein said illuminating means includes a laser beam illuminating source, and a galvanomirror oscillating along the longitudinal direction of the wafer-target-pattern.

5. A projection alignment apparatus according to claim 2, wherein said light-intensity distribution detection means includes a storage type solid-state image pickup element.

6. A projection alignment method for projecting a circuit pattern on a mask to a wafer through a projection lens, comprising the steps of:
    illuminating a slit-like monochromatic light having a narrow spectral width and being stopped so as to be substantially parallel to an alignment direction at a right angle to a longitudinal direction of a wafer-target-pattern and for providing light fluxes from a plurality of angles in a plane extending in the longitudinal direction of the wafer-target-pattern and perpendicular to the wafer surface through the projection lens so that most high frequency components of reflected diffraction light fluxes are limited within the range of an incident pupil of the projection lens;
    image-forming the reflected diffraction light fluxes from the wafer-target-pattern incident on the projection lens;
    detecting an intensity distribution of the reflected diffraction light fluxes as to the alignment direction by scanning in the alignment direction; and
    detecting the position of the alignment direction of the wafer-target pattern in accordance with the detected intensity distribution of the reflected direction light fluxes.

7. A projection alignment method according to claim 6, wherein the step of illuminating includes utilizing a monochromatic light source, a slit member and a cylindrical lens.

8. A projection alignment method according to claim 7, wherein the step of detecting an intensity distribution includes utilizing a storage type solid-state image pickup element.

9. A method according to claim 6, wherein the wafer-target pattern is formed as a strip pattern.

10. A projection alignment method according to claim 6, wherein the step of illuminating includes utilizing a laser beam illuminating source and a galvanomirror oscillated along the longitudinal direction of the wafer-target-pattern.

* * * * *